(12) United States Patent
Brohan et al.

(10) Patent No.: US 11,139,433 B2
(45) Date of Patent: Oct. 5, 2021

(54) TUNGSTATE ION SOLUTION AND HYBRID PHOTOVOLTAIC DEVICE

(71) Applicants: Centre national de la recherche scientifique, Paris (FR); Commissariat à l'énergie atomique et aux énergies alternatives, Paris (FR); UNIVERSITE DE NANTES, Nantes (FR)

(72) Inventors: Luc Brohan, La Chappelle sur Erdre (FR); Mireille Richard-Plouet, Suce sur Erdre (FR); Moustafa El Kass, Dijon (FR); Noëlla Lemaitre, Chambery (FR); Solenn Berson, Chambery (FR)

(73) Assignees: CENTRE NATIONAL DE LA RECHERCHE SCIENTIFIQUE, Paris (FR); COMMISSARIAT À L'ÉNERGIE ATOMIQUE ET AUX ÉNERGIES ALTERNATIVES, Paris (FR); UNIVERSITE DE NANTES, Nantes (FR)

( * ) Notice: Subject to any disclaimer, the term of this patent is extended or adjusted under 35 U.S.C. 154(b) by 0 days.

(21) Appl. No.: 16/069,389

(22) PCT Filed: Jan. 12, 2017

(86) PCT No.: PCT/EP2017/050613
§ 371 (c)(1),
(2) Date: Jul. 11, 2018

(87) PCT Pub. No.: WO2017/121830
PCT Pub. Date: Jul. 20, 2017

(65) Prior Publication Data
US 2019/0019953 A1 Jan. 17, 2019

(30) Foreign Application Priority Data

Jan. 12, 2016 (FR) ..................... 16 50216

(51) Int. Cl.
H01L 51/00 (2006.01)
C01G 41/02 (2006.01)
H01L 51/42 (2006.01)
H01G 9/20 (2006.01)

(52) U.S. Cl.
CPC .......... H01L 51/0007 (2013.01); C01G 41/02 (2013.01); H01G 9/2004 (2013.01); H01L 51/0028 (2013.01); H01L 51/422 (2013.01); H01L 51/4253 (2013.01); H01L 51/4273 (2013.01)

(58) Field of Classification Search
CPC ............. H01L 51/0003; H01L 51/0004; H01L 51/0005; H01L 51/0007; H01L 51/0028; H01L 51/422; H01L 51/4253; H01L 51/4273; C01G 41/00; C01G 41/02;
C09D 7/20; C09D 7/63; C09D 11/03; C09D 11/033; C09D 11/36; C09D 11/38; C09D 11/52; B01J 23/30; B01J 23/6527; B01J 23/687; B01J 23/888; B01J 31/34; H01G 9/2004
See application file for complete search history.

(56) References Cited

U.S. PATENT DOCUMENTS

| | | | |
|---|---|---|---|
| 2,892,216 A | 6/1959 | Steel | |
| 4,626,424 A * | 12/1986 | Kim | C01G 41/00 423/594.13 |
| 5,772,978 A * | 6/1998 | Bailey | C01G 41/02 423/606 |
| 5,984,997 A * | 11/1999 | Bickmore | B01J 6/008 75/343 |
| 5,987,997 A * | 11/1999 | Roskam | G01F 1/667 73/861.29 |
| 6,464,765 B1 * | 10/2002 | Garcia | C09D 11/037 106/31.05 |
| 8,304,099 B2 * | 11/2012 | Chung | B82Y 30/00 252/519.1 |
| 9,049,771 B2 * | 6/2015 | Yoshimoto | C09K 11/06 |
| 9,425,344 B2 | 8/2016 | Brohan et al. | |
| 2015/0024539 A1 | 1/2015 | Brohan et al. | |
| 2015/0200091 A1 * | 7/2015 | Chada | H01L 21/02172 438/694 |

FOREIGN PATENT DOCUMENTS

CN 102773114 A * 11/2012

OTHER PUBLICATIONS

English language machine translation of Yang et al. CN 102773114 A (Year: 2012).*
Chen D et al: "Low-temperature synthesis of metal tungstates nanocrystallites in ethylene glycol", Materials Research Bulletin, Elsevier, Kidlington, GB, vol. 38, No. 14, Nov. 26, 2003 (Nov. 26, 2003), pp. 1783-1789, XP004473152, ISSN: 0025-5408, DOI: 10.1016/J.Materresbull.2003.09.004 p. 1784.
Vidmar Tjasa et al: "Inkjet printing of sol-gel derived tungsten oxide", Solar Energy Materials and Solar Cells, vol. 125, Mar. 15, 2014 (Mar. 15, 2014), pp. 87-95, XP028641281, ISSN: 0927-0248, DOI: 10.1016/J.SOLMAT.2014.02.023 p. 94.
International Search Report for PCT/EP2017/050613, dated Mar. 24, 2017.
Written Opinion of the International Search Authority for PCT/EP2017/050613, dated Mar. 24, 2017.
(Continued)

Primary Examiner — Matthew R Diaz
(74) Attorney, Agent, or Firm — B. Aaron Schulman, Esq.; Stites & Harbison, PLLC

(57) ABSTRACT

The invention concerns a solution of tungstate ions $W^{6+}$ (VI) comprising as solvent at least one optionally partly etherified polyalcohol, a preparation method and uses thereof. The invention further concerns a layer comprising at least one tungsten oxide $WO_z$ comprising one or more polyoxotungstate complexes, methods for preparing the same and uses thereof, and in particular a photovoltaic device comprising said layer of material.

14 Claims, 4 Drawing Sheets

(56) References Cited

OTHER PUBLICATIONS

Guillain, et al, "Annealing-free solution-processed tungsten oxide for inverted organic solar cells", 2014, pp. 251-256, vol. 122, Solar Energy Materials & Solar Cells.

Stubhan, et al, "Hill Fill Factor Polymer Solar Cells Incorporating a Low Temperature Solution Processed WO3 Hole Extraction Layer", 2012, pp. 1433-1438, vol. 2, Adv. Energy Master.

* cited by examiner

TUNGSTATE ION SOLUTION AND HYBRID PHOTOVOLTAIC DEVICE

The present invention is directed towards a tungsten ion solution suitable for the depositing of a tungsten oxide film, in particular to allow the collecting of photogenerated holes in a hybrid photovoltaic device.

The present invention concerns a method for preparing said solution and said tungsten oxide film, and applications thereof.

In the sphere of photovoltaic devices, particularly hybrid organic photovoltaic devices, cell yields and lifetimes are largely improved through the insertion of an interface layer collecting photogenerated carriers between the electrodes and the active material. While commercially available solutions exist, as well as many studies at the research stage, regarding the hole-blocking layer at the cathode, there are few solutions to promote hole transfer and the blocking of electrons at the cathode.

In addition, the solutions generally applied comprise a certain number of elements that are toxic or incompatible with deposit technologies of wet process type, such as print or coating techniques.

From Frédéric Guillain et al., (Solar Energy Materials and Solar Cells 2014, 122, 251-256), the preparation is known of a tungsten oxide layer to prepare organic photovoltaic cells. The described method comprises the preparation of a sol-gel of tungsten oxide for deposition via spin coating. This sol-gel is prepared by mixing tungsten(V) ethoxide, acetic acid in isopropyl alcohol. However, a method employing a sol-gel of tungsten oxide has problems of stability, particularly stability over long-term storage. Vidmar et al. (Solar Energy Materials and Solar Cells, 2014, 125, 87-95) also describes the preparation of a tungsten oxide sol. Initially, peroxotungstic acid is synthesized by reaction of a tungsten powder and hydrogen peroxide. The sol is then diluted with a mono-alcohol solvent (2-propanol or 2-propoxy ethanol). The addition of alcohol leads to the formation of a tungsten ether (esterification) which polymerizes to peroxo polytungstic acid. The ink is slightly orange. However, here again, the prepared ink exhibits stability problems in particular for long-term storage, and there subsists a need to increase the efficiency of photovoltaic conversion.

Stubhan et al. (Advanced Energy Materials, 2012, 2, 1433-1438) describes a method for preparing a colloidal solution comprising the dispersion of tungsten oxide particles in an alcohol. This method has the technical disadvantage of using nanoparticles of tungsten oxide that it is precisely sought to avoid in the present invention, in particular with a view to proposing an industrial method limiting the toxicity of the materials used. U.S. Pat. No. 5,984,997 concerns the preparation of a solution of $WO_4^{2-}$ but does not describe polyoxotungstate complexes.

Chen D. et al. ("Low-temperature synthesis of metal tungstates nanocrystallites in ethylene glycol", Materials Research Bulletin, Elsevier, Kidlington, GB, vol. 38, no. 14, 26 Nov. 2003 (2003 Nov. 26), pages 1783-1789) describes a reaction between a $Na_2WO_4$ powder in the presence of $MCl_2.nH_2O$ in a solvent of ethylene glycol type. This reaction leads to the formation of precipitates and then to isolation of a powder, of nanoparticles in particular.

It is technically difficult to prepare a stable, transparent solution allowing the preparation of a semiconductor material able to be used in a photovoltaic device, in particular using a method to deposit said semiconductor material via wet process, and in particular via printing or coating.

It is therefore the objective of the present invention to solve one or more and preferably all the technical problems set forth above.

In particular, the objective of the present invention is to solve the technical problem whereby a solution is provided able to be deposited on a solid substrate to form a layer of material having a work function that is compatible with the electron level of photogenerated holes, the work function (eφ) for a metal being the energy that must be supplied to an electron at the Fermi level to pull it away from the metal and bring it to the vacuum level (infinite). For an insulator or semiconductor, both devoid of electrons at the Fermi level, this designation is improperly used to designate electronic affinity (eχ) which is the energy which must be supplied to extract an electron towards the vacuum level.

It is the objective of the invention to solve the technical problem by providing a solution is provided that is stable over time.

It is also the objective of the present invention to solve the technical problem by providing a transparent solution, and preferably that is able to be employed for wet process depositing, in particular via printing or coating.

It is a particular objective of the present invention to solve the technical problem by providing a method to prepare said solution, that is simple and has easy industrial applicability. A further particular objective of the present invention is to solve the technical problem by providing said method limiting the negative impact of chemical pollutants or toxic compounds usually employed in prior art methods.

A further objective of the present invention is to solve the technical problem by providing a method to prepare a material that in particular has a work function compatible with the electron level of photogenerated holes, and preferably compatible with a technique to deposit the semiconductor material via wet process.

It is a further objective of the present invention to solve the technical problem by providing a photovoltaic device. In particular, it is the objective of the present invention to solve the technical problem by providing a photovoltaic cell having a satisfactory yield and/or lifetime, preferably equivalent to those having an interface layer of p-type composed of a reference material in this field at the present time, such as PEDOT:PSS. PEDOT:PSS designates the mixture of two polymers:poly(3,4-ethylenedioxythiophene) (PEDOT) and poly(sodium styrene sulfonate) (PSS).

It has been discovered by the present inventors that one or more and preferably all the technical problems set forth above can be solved by the present invention.

For this purpose, the subject of the invention is a solution of tungstate ions $W^{6+}$ (VI) comprising as solvent at least one polyalcohol that is optionally partly etherified.

According to one variant, the solvent comprises or is composed of a glycol compound optionally partly etherified.

According to one variant, the solvent comprises or is composed of ethylene glycol.

According to one variant, the solution has a concentration of tungsten ions of 0.001 to 1 $mol·L^{-1}$.

According to one preferred variant, the concentration of tungstate ions ranges from 0.01 to 0.5 $mol·L^{-1}$, preferably from 0.01 to 0.2 $mol·L^{-1}$, and more preferably from 0.04 to 0.1 $mol·L^{-1}$.

According to one advantageous embodiment, the concentration of tungsten ions ranges from 0.05 to 0.1 $mol·L^{-1}$.

Advantageously, the solution of tungsten ions comprises one or more polyoxotungstate complexes. The neutralisation of such complexes by a solution of sodium hydroxide generally takes place via three equivalences at 0.6, 1.1 and 2.3 H$^+$/W, the latter possibly being offset to a higher value depending on starting acidity relative to the initial tungsten concentration and/or the preparation temperature of the solution. In an organic medium, the stable polyanion, in the presence of protons, is generally [W$_6$O$_{19}$]$^{2-}$ the neutralisation of which could involve two polyanionic intermediates such as [W$_{10}$O$_{32}$]$^{4-}$ then [W$_7$O$_{24}$]$^{6-}$, until neutralisation of all acidities.

Advantageously the solution is a limpid solution.

By «limpid» is particularly meant a transparent solution e.g. here of orangish-yellow colour.

By polyalcohol is meant a compound comprising at least two hydroxy groups, also called hydroxyl groups, and in particular diols and triols, particularly vicinal diols.

According to one variant, the polyalcohol is a glycol.

According to one embodiment, the glycol is selected from among alkylene glycols and mixtures thereof.

In the meaning of the invention, alkylene glycols include the derivatives thereof. Among the derivatives, mention can be made of derivatives of partly etherified type. According to one variant, the etherified «alkylene» glycol is an alkyl ether of alkylene glycol e.g. an ether of propyl alkylene glycol. Particular mention can be made of propylene glycol propyl ether.

«Alkyl» notably designates an alkyl or alkylene group having 1 to 10 carbon atoms.

By «etherified» is meant a solvent of which one or more of the hydroxy groups are used for an etherification reaction, in particular to graft an alkyl group. These reactions are known to persons skilled in the art. Etherified polyalcohols and etherified glycols are commercially available.

According to one variant, the solvent is selected from among ethylene glycol, propylene glycol, propylene glycol propyl ether, or any of the mixtures thereof.

According to one variant, the solvent has a boiling point lower than 180° C., at atmospheric pressure (101325 Pa).

According to one variant, the solvent has viscosity adapted for printing or coating techniques e.g. ranging from 2 to 64 cP, e.g. 4 to 54 cP, e.g. 4 to 25 cP, or 8 to 19 cP, at 25° C. and at atmospheric pressure (101325 Pa).

Advantageously, the solvent is non-toxic for human beings.

One variant concerns the use of a tungstate ion solution in ethylene glycol in the optional presence of other compounds One variant concerns the use of a tungstate ion solution in propylene glycol in the optional presence of other compounds.

One variant concerns the use of a tungstate ion solution in propylene glycol propyl ether in the optional presence of other compounds.

By «solvent» is notably meant a compound solvating a chemical species, and in particular here a compound solvating compounds comprising tungsten in ionic form.

Advantageously, the tungstate ion solution is non-colloidal.

Advantageously, the tungstate ion solution is monophase. For example, it does not have any dispersed or suspended solid measurable for example by a dynamic light scattering method (DLS) for which the detection limit of particles present is about 1 nm in diameter.

The solution of the present invention has viscosity adapted for a method to prepare a layer of tungsten oxide via wet process, and in particular using a printing or coating technique.

In one variant, said solution has a dynamic viscosity of between 2 and 64 cP, e.g. between 4 and 54 cP, e.g. between 4 and 25 cP, or between 8 and 19 cP, at 25° C. and at atmospheric pressure (101 325 Pa). Typically, the viscosity is obtained by measuring with a densimeter/viscometer by Anton Paar: DENSIMETER DMA 4100 M coupled with a Module LOVIS 2000 ME MICROVISCOMETER. The measuring method is based on the time to displace a gold bead along a capillary of diameter 1.59 mm for viscosities of 0.7 to 15 mPa·s, and of diameter 1.8 mm pour for viscosities of 13 to 300 mPas·s.

In particular, it was not obvious that a solution of the present invention would be able to be stable at ambient temperature and in particular for a satisfactory length of time.

Also, it was not obvious that such solutions could be employed with ease to prepare a semiconductor material able to be prepared via wet process, and in particular by printing or coating.

It was additionally not obvious that a solution of the present invention could be transparent.

According to one variant, the solution of the invention comprises at least one oxidizing agent.

For example, an oxidizing agent can be selected from among: a peroxide, and more particularly hydrogen peroxide.

The invention also concerns a method to prepare a tungstate ion solution such as defined in the present invention and obtained with a step to increase the temperature of a suspension or gel of precursors of tungstate ions in a polyalcohol solvent, and preferably held at a temperature higher than 120° C.

According to one embodiment, the precursor of tungstate ions is selected from the group formed by Na$_2$WO$_4$, (NH$_4$)$_2$WO$_4$, H$_2$WO$_4$ and any of the mixtures thereof.

Preferably a solvent is employed having a viscosity, at ambient temperature (25° C.) and at atmospheric pressure, adapted for a deposit method via wet process and in particular by printing or coating. Solvents are further preferred having a sufficiently low boiling point to limit heating energy costs when removing the solvent to form the tungsten oxide layer.

According to one variant, a solvent is employed having a viscosity of between 1 and 64 mPa·s at 25° C.

In one variant, a solvent is selected having a boiling point of between 100 and 300° C., preferably lower than 250° C., and more preferably lower than 225° C.

In one advantageous variant, ethylene glycol is employed having a viscosity of 16.06 mPa·s at 25° C. and a boiling point of 197.3° C. Ethylene glycol, in addition to these properties of solution stability, has physicochemical properties adapted for deposit via wet process e.g. via printing or coating.

In one variant, the temperature to obtain the tungstate ion solution from a suspension or gel of precursors of tungstate ions ranges from 100 to 300° C., and is preferably lower than 250° C., more preferably lower than 200° C.

In one variant, the temperature to obtain the tungstate ion solution from the suspension or gel of precursors is between 100 and 150° C., e.g. between 110 and 140° C.

In one variant, the length of the temperature hold, when preparing the tungstate ion solution from the suspension or gel of precursors, is between five minutes and three days, e.g. between one hour and forty-eight hours, and typically about twenty-four hours.

In one variant, the pressure at the temperature hold step, when preparing the tungstate ion solution from the suspension or gel of precursors, is atmospheric (about 101325 Pa), a pressure lower than atmospheric or a pressure higher than atmospheric. In one variant, the pressure is autogenous and is obtained for example by increasing the temperature in an autoclave.

Advantageously, the solution obtained does not contain any colloid as measured by dynamic light scattering (DLS).

In one variant, the solution comprises polyoxotungstate complexes. For example, it can be sought to evidence these complexes by titrimetric assay e.g. with sodium hydroxide. The number of neutralized moles of $H^+$ ions compared with the number of moles of tungsten W present in solution can confirm the presence of different polyoxotungstate complexes in each pH domain.

The invention most advantageously allows stabilisation at ambient temperature of tungstate ion solutions, and more particularly of polytungstate ions in a polyalcohol medium, particularly a glycolic medium, and notably in an optionally etherified ethylene glycol or propylene glycol medium, starting from commercial precursors having viscosities adapted to the deposit method of a semiconductor material via wet process, in particular via printing or coating.

In one variant the temperature is increased, preferably with a hold at the desired temperature in an autoclave.

In one variant the temperature is increased, preferably with a hold at the desired temperature under reflux.

In one embodiment, the formation of the polyoxotungstate complex(es) is obtained by heating, in particular in an autoclave or under reflux.

The invention also concerns a tungsten oxide layer $WO_z$ comprising one or more polyoxotungstate complexes, where z is a figure higher than 2.7 and preferably higher than 2.8, computed from the results of X-Ray photoelectron spectrometry (XPS), said tungsten oxide having an atomic proportion of tungsten in oxidation state 5 ranging from 3 to 6% relative to total tungsten, said proportion being computed from the results of X-Ray photoelectron spectrometry (XPS).

By «tungsten oxide layer» is meant a layer comprising at least one tungsten oxide without limitation regarding the presence of other components in this layer. A tungsten oxide layer can be designated as such in a photovoltaic device.

In one embodiment, the tungsten oxide layer comprises an oxide of $WO_z$ type, where z is a figure higher than 2.7 and preferably higher than 2.8, computed from the results of X-Ray photoelectron spectrometry (XPS).

In one embodiment the tungsten oxide layer comprises an oxide of $WO_z$ type, where z is a figure higher than 2.9 computed from XPS results.

For example, a film in the aforementioned article by Guillain et al. prepared from a sol comprises an oxide of $WO_{2.7}$ type.

In one variant, the tungsten oxide layer comprises less than 10%, preferably less than 7% of tungsten oxide in oxidation state 5 ($W^{5+}$), the percentage being expressed in atomic percentage.

The ratio of tungsten in oxidation state 6 relative to tungsten in oxidation state 5 can be computed from spectra obtained with XPS. It is particularly the ratio of the peaks associated with transitions from levels $4f_{7/2}$ positioned at 35.7 and 34.5 eV, (pollution C1s positioned at 284.7 eV) for $W^{6+}$ and $W^{5+}$, respectively.

Said layer is particularly adapted for the fabrication of an organic or hybrid electronic device, in particular for conversion of solar energy to electricity, such as an organic (OPV) or hybrid photovoltaic cell, but also for electrochromic glazing, photodetectors, organic light emitting diodes (OLED) and polymer light emitting diodes (PLED). Advantageously, the conversion yield of a photovoltaic device is satisfactory through implementation of the invention.

The invention also concerns a method for preparing a tungsten oxide layer $WO_z$ deposited on a solid substrate, said method comprising the preparation of a solution able to be deposited via wet process on the solid substrate, said solution comprising tungstate ions $W^{6+}$ (VI) and at least one optionally partly etherified polyalcohol as solvent, the depositing of the solution on a solid substrate, removal of the solvent from the solution, and the obtaining of a film of tungsten oxide $WO_z$ on the solid substrate.

By solid substrate is meant a substrate of solid type than can be flexible or rigid for example.

The method of the invention advantageously allows a stable, transparent solution to be obtained able to be employed for a method to deposit a layer via wet process, and in particular using a printing or coating technique.

Advantageously, said method comprises the placing of tungstate ions in solution in a polyalcohol solvent, optionally partly etherified, that may form a first solvent, optionally the removal at least in part of the first solvent to increase the concentration of tungstate ions, optional dilution through the addition of a second solvent called «volatile solvent» having a boiling point lower than the boiling point of the first solvent, followed by the depositing of the solution comprising the volatile solvent on the solid substrate and the removal of the first solvent and volatile solvent, if present, to form a film of tungsten oxide $WO_z$ on the solid substrate.

In one variant the removal of the solvent, optionally the removal of the volatile solvent, is conducted at a temperature higher than the boiling point of the solvent.

In one variant, the method comprises the placing of tungstate ions in solution in the presence of an oxidizing agent.

In one variant, the method comprises a step for vacuum removal of the solvent to form the film of tungsten oxide.

In one variant the method comprises a removal step, optionally removal of the volatile solvent, conducted at a temperature higher than 80° C., e.g. higher than 100° C., and preferably at a temperature higher than 130° C.

In one variant, the method comprises a removal step, optionally removal of the volatile solvent, conducted at a temperature higher than 160° C., e.g. higher than 180° C., and preferably at a temperature higher than 200° C.

Preferably, the temperature for the solvent removal step is lower than 300° C., preferably lower than 250° C. and more preferably lower than 225° C.

By volatile solvent is meant a solvent having a boiling point lower than the polyalcohol solvent of the tungstate ions. For example, it is possible as solvent to use a solvent having a boiling point lower than 180° C. e.g. lower than 150° C., and more preferably lower than 120° C.

Among oxidizing agents, it is possible in particular to use: a peroxide such as hydrogen peroxide for example.

Advantageously depositing is carried out by printing or coating, preferably by spin coating, by ink jet printing, by screen printing, by heliogravure, by slot die, by roll to roll or tape casting.

The invention further concerns a semiconductor material comprising or composed of a layer such as defined in the invention or able to be obtained with a method such as defined in the invention.

Advantageously, the work function of this material is compatible with the collecting of photogenerated holes.

The invention also concerns a photovoltaic device comprising a layer of active material for photo-conversion and a semiconductor material such as defined in the invention.

In one variant, the photovoltaic device is a photovoltaic cell, a photovoltaic cell of PIN or NIP type, an organic transistor, or a light emitting diode, an organic light emitting diode (OLED), a polymer light emitting diode (PLED), electrochromic glazing or a photodetector.

Persons skilled in the art have knowledge of the architecture of organic or hybrid electronic devices. Different architectures can be envisaged in the present invention. Particular mention can be made of organic or hybrid multilayer light-emitting architectures such as HTL/ETL, HTL/AL/ETL, HIL/HTL/AL/ETL, HIL/HTL/AL/ETL/EIL, HIL/HTL/electron-blocking layer or hole-blocking layer/AL/ETL/EIL, HIL/HTL/AL/hole-blocking layer/ETL/EIL. HTL designates the Hole-Transporting Layer, HIL designates the Hole-Injecting Layer, AL designates the Active Layer e.g. for OLEDs a Light-Emitting Layer, EIL designates the organic Electron-Injecting Layer»), «electron-blocking layer», «electron-blocking layer».

Typically, the device of the invention is an Organic Photovoltaic device (OPV).

In one variant, the invention concerns a photovoltaic cell of inverted structure, also called a NIP structure. In other words, the tungsten oxide layer is deposited on an active polymer layer.

In an inverted structure, the stack has the following sequence for example:
substrate;
conducting layer containing a conducting oxide acting as first electrode;
n (or N) semiconductor layer;
active layer;
p (or P) semiconductor layer;
conducting layer acting as second electrode or top electrode.

Therefore, in one variant of the invention, the layer comprising the tungsten oxide is arranged on the surface of the active layer of the device that is stacked on the layers arranged on the substrate.

In one variant, the conducting layer acting as second electrode or top electrode is an anode.

In another aspect, the invention concerns a method for fabricating a photovoltaic device which, in addition to the depositing of a tungstate ion solution according to the invention to form a tungsten oxide layer, also comprises the depositing on a substrate of a colloidal solution (in typical form of a sol-gel material) to form a layer of n-type semiconductor material such as $TiO_2$. Said method can be implemented following the method described in international application WO2013/050222 or granted French patent FR 11 58275.

Depending on the type of substrate, the layer of n material can be annealed at between 50 and 200° C. For example, it has a thickness of between 10 and 200 nm. The active layer of the photovoltaic device is then generally deposited on the layer of n material. Heat treatment at between 50 and 180° C. for 0 to 30 minutes often allows optimisation of the morphology of the active layer. An anodic interface layer is then generally deposited on the active layer. This interface layer can be prepared following the method of the present invention from a tungstate ion solution. Heat treatment at a temperature typically of between 50 and 180° C. for 0 to 30 minutes usually allows optimisation of the performance of the device. An electrode is typically deposited via liquid process or via vacuum evaporation on the p-type layer. For example, the thickness thereof is between 10 and 200 nm.

The cathode and anode are typically composed of conducting materials:

metals such a silver, titanium, aluminium, calcium, magnesium, etc.

or conducting metal oxides, preferably transparent, such as $Sn^{4+}$ or ITO-doped $In_2O_3$, $Al^{3+}$ or AZO-doped ZnO, indium or IZO-doped ZnO, F or FTO-doped $SnO_2$;

or inorganic/hybrid materials such as a carbon nanotube material or CNT, graphene, silver nanowires;

or organic conducting materials of polythiophene-doped type for example or PEDOT:PSS, optionally containing metal particles such as silver nanowires for example, or conducting carbon compounds such as carbon nanotubes and/or graphene;

or a stack of oxide/metal/oxide type such as TCO/M/TCO for example (Transparent Conductive Oxide; M being a metal). It is typically an ITO/Ag/ITO stack.

The active absorbent layer is generally composed of an n-type semiconductor material (e.g. one of more doped fullerenes, fullerene derivatives e.g. PCBM ([6,6]-phenyl-$C_{61}$-butyric acid methyl ester), perylene, n-type semiconductor polymers, etc.) in a mixture with a p-type semiconductor material (P3HT, polythiophene and derivatives thereof, copolymers of polythiophene or polycarbazole, etc,). Mention can also be made of hybrid organic-inorganic perovskites such as those of formulation $MAMeX_3$, MA being an organo-ammonium ion, Me being Pb or Sn, and X is selected from among: Cl, Br, I or a combination of these halides.

The n-type cathodic interface layer such as ZnO, $TiO_2$, etc. can be prepared using a technique known to skilled persons.

The anodic interface layer in the invention comprises a tungsten oxide layer according to the invention.

According to one advantageous embodiment, the tungsten oxide layer is prepared from the solution of the invention by printing. Depending on the type of underlying layer, printing strategies are adapted to obtain homogeneous layers of desired thickness. Advantageously, the tungstate ion solution according to the present invention allows very good homogeneity of the deposited film to be obtained. The concentration of tungsten oxide in the solution used is adapted to the print strategy. The solutions of the invention are stable and compatible with printing techniques.

Yields (Power Conversion Efficiency) of the photovoltaic device of the present invention are typically 2 to 5%.

Although it is sought to reduce the drying temperature of the interface layer of tungsten oxide, it has been discovered that conversion efficiency increases with the drying temperature of the tungsten oxide interface layer. The effect of drying temperature allows power conversion to be increased up to a value higher than 3%. The improvement chiefly concerns open-circuit voltage and form factor in comparison with p-type conducting polymers conventionally used in the prior art e.g. PEDOT:PSS.

In one aspect, the invention concerns a tungsten oxide layer according to the present invention used as electron-blocking layer and/or hole collecting layer.

Each organic layer may possibly have the same or a different structure from one device to another when several photovoltaic devices are assembled together. Typically, the thickness of the interface region ranges from 5 100 nm and advantageously from 30 to 50 nm. One typical architecture is the following: glass/ITO/$WO_x$/P3HT:PCBM/ETL(n)/Ag or glass/ITO/$WO_x$/P3HT:PCBM/ETL(n)/Ca/Al, ETL(n), ETL designating an electron-transporting layer.

Most advantageously, the tungsten oxide layer is transparent. For example, the thickness of the layer is less than 100 nm and is transparent to the eye in visible light.

Typically, the term transparent tungsten oxide layer is used in particular for OPVs and/or OPDs (organic photodiodes), when the material has transmittance of at least 90% in the 400 nm-900 nm window with a thickness of 100 nm or greater.

In one variant, the tungstate ion solutions are concentrated before deposit on a substrate. Surprisingly, the stability and transparency of the solutions are preserved after concentration of the tungstate ion solutions, for example after evaporation of at least one half of the mass of solvent(s) initially present. This pre-concentration technique allows limiting of the amount of solvents to be removed once the liquid film is deposited on the substrate. The solution can be concentrated up to the solubility limit of the tungstate ions contained therein.

Surprisingly, the films obtained in cases when the solutions are pre-concentrated are more homogeneous. It is considered that a film is homogeneous if no cracks are seen in a SEM micrograph under ×27 magnification.

With the method of the invention it is advantageously possible to adjust the drying temperature of the film deposited on a substrate by diluting the optionally pre-concentrated tungstate ion solution with a solvent having a lower boiling point than that of the solvent initially used, in particular to prepare the tungstate ion solution, with a view to limiting drying temperature. This variant of the invention has a particular advantage when depositing is performed on substrates sensitive to high temperatures such as plastic substrates or of inverted architecture.

In another aspect, the invention concerns the use of a tungstate ion solution according to the invention or of a tungsten oxide layer as interface layer at the anode, for example to block the electrons in an organic or hybrid photovoltaic cell. The present invention also has the advantage of proposing a fabrication method employing a solution with non-toxic solvent without the use of oxygenated water or of nanoparticles. The method of the invention also has the advantage of having a reduced number of production steps.

The present invention also has the advantage of replacing a type-p layer e.g. the PEDOT:PSS polymer having a trace of acidity, by a tungsten oxide layer.

The production cost of the present invention is reduced compared with the current method which particularly employs the PEDOT:PSS polymer. In one variant of the invention, the handling time to prepare the tungstate ion solution is less than one hour and the heating time is typically twenty-four hours, this being a very important technical advantage.

One important advantage of the method of the present invention is the reliability and reproducibility thereof. This aspect translates as a reproducible J/V curve for organic solar cells. In particular, the method of the invention has an advantage compared with the method known in the state of the art which uses an organic polymer of PEDOT:PSS type, since molecular weight dispersion of the polymer differs from one supplier to another and changes over time thereby necessitating adjustment of preparation methods (e.g. viscosity). As a result, this parameter in prior art methods significantly modifies the physical properties of the device. The method of the present invention overcomes this technical drawback.

The invention further concerns the use of a tungstate ion solution such as defined in the invention or able to be obtained with the method such as defined in the invention, to form a semiconductor layer comprising a tungsten oxide.

The invention also concerns a method to fabricate a photovoltaic device comprising the preparation of a semiconductor layer such as defined in the invention.

The invention also concerns a method to produce electrical energy comprising the use of a semiconductor material such as defined in the invention, or of a photovoltaic device such as defined in the invention, to produce electrical energy from sun radiation.

The addition of other co-solvents (such as other alcohols) can improve the formulations able to be applied via wet process, paying heed to the characteristics of the parent solution (stability, . . . ) and to the characteristics of the layers obtained (morphology, transparency, resistivity, work function . . . ).

When using a semiconductor of the present invention, an increase in the stability and lifetime of the photovoltaic device is expected, notably because the layer is particularly homogeneous and transparent.

Figure 5:
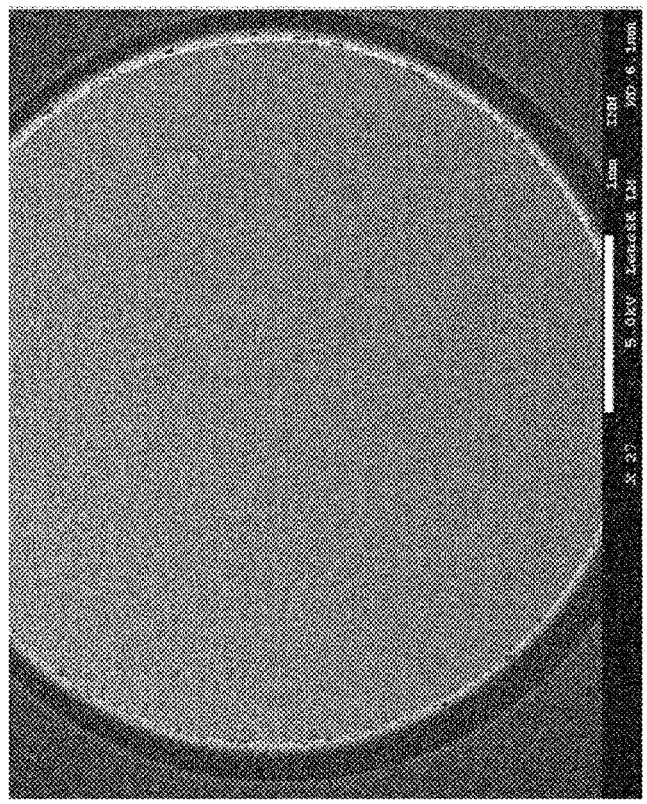
Figure 5:
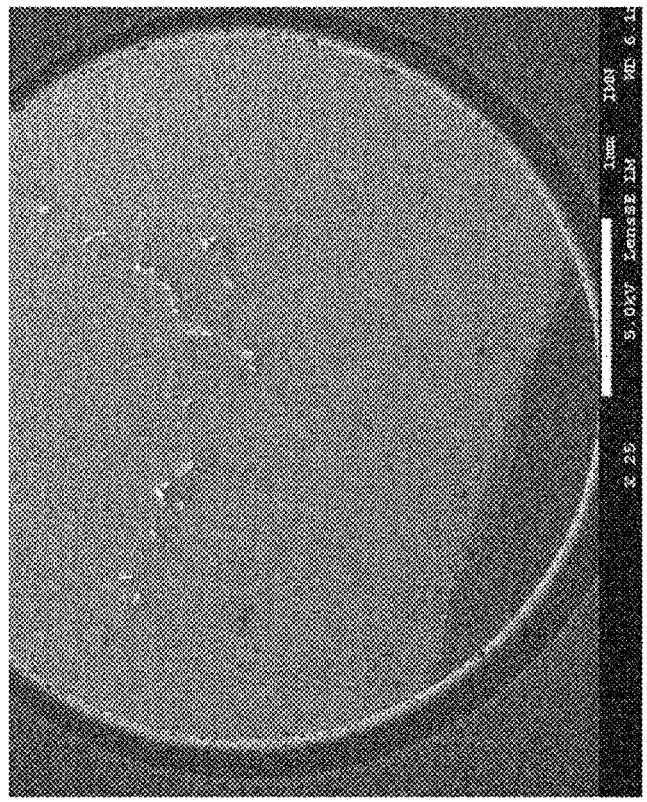

FIG. 5 provides scanning microscope images of the surface of films dried at 50° C., 10 minutes, obtained with the parent solution of tungsten oxide percursors in propylene glycol solvent.

The term «according to the invention» refers to all the aspects and embodiments of the invention, including the examples and preferred embodiments thereof, including any of the combinations thereof with no limitation.

Other objectives, characteristics and advantages of the invention will become clear to persons skilled in the art on reading the explanatory description referring to examples that are given solely for illustration purposes and in no manner limit the scope of the invention.

The examples form an integral part of the present invention, and any characteristic that appears to be novel compared with any prior art technique and arising from the description as a whole, including the examples, forms an integral part of the purpose of the invention and the invention in general.

Therefore, the extent of the scope of each example is general.

Also, in the examples all the percentages are weight percentages unless otherwise indicated, temperature is expressed in degrees Celsius unless otherwise indicated, and pressure is atmospheric pressure unless otherwise indicated.

EXAMPLES

Example 1: Preparation of Tungstate Ion Solutions According to the Invention

Different tungsten reagents were tested: $Na_2WO_4$, $(NH_4)_2WO_4$ and $H_2WO_4$ and different glycols such as propylene glycol, ethylene glycol, propylene glycol propyl ether. The tested tungsten concentration ranged from 0.05 to 0.20 mol·L$^{-1}$. After agitation for 2 h, the suspension or gel of yellow colour was placed in an autoclave at a temperature of 120° C., for 24 h. The final solutions obtained were always yellow in colour but transparent and able to be used for at least 6 months. This solution is employed as such for the depositing of interface layers.

Example 1.1

0.374 g of $H_2WO_4$ and 30 mL of ethylene glycol are placed under magnetic stirring for 2 h; the mixture leads to a gel of yellow colour that is placed in an autoclave at 120° C. for 24 h.

Example 1.2

The same protocol as in Example 1.1 is followed, using propylene glycol as solvent instead of ethylene glycol.

Example 1.3

0.494 g of $Na_2WO_4$ and 30 mL of ethylene glycol are placed under magnetic agitation for 2 h, the mixture leads to a gel of yellow colour that is placed in an autoclave at 120° C. for 24 h.

The solutions obtained in Examples 1.1., 1.2. and 1.3. are transparent and stable as specified in the introduction to the above examples.

Dynamic light scattering performed on the solutions obtained confirms the absence of any colloids having a hydrodynamic diameter greater than 1 nm.

The polyoxotungstate complexes formed in solution are evidenced as follows:

Titrimetric assay is performed on 20 mL of the transparent solution synthesized according to the above examples. Changes in the pH curve are monitored as a function of the volume of added base (sodium hydroxide). The curves have the same shape irrespective of the concentration of the precursor, in the range of 0.05 to 0.1 mol/L. Three points of equivalence are identified each of which corresponds to neutralisation of a different acidity. The number of moles of neutralised $H^+$ ions relative to the number of moles of tungsten contained in the solution confirms the presence of different polyoxotungstate complexes in each pH domain (Table 1 below and FIG. 1).

Figure 1:
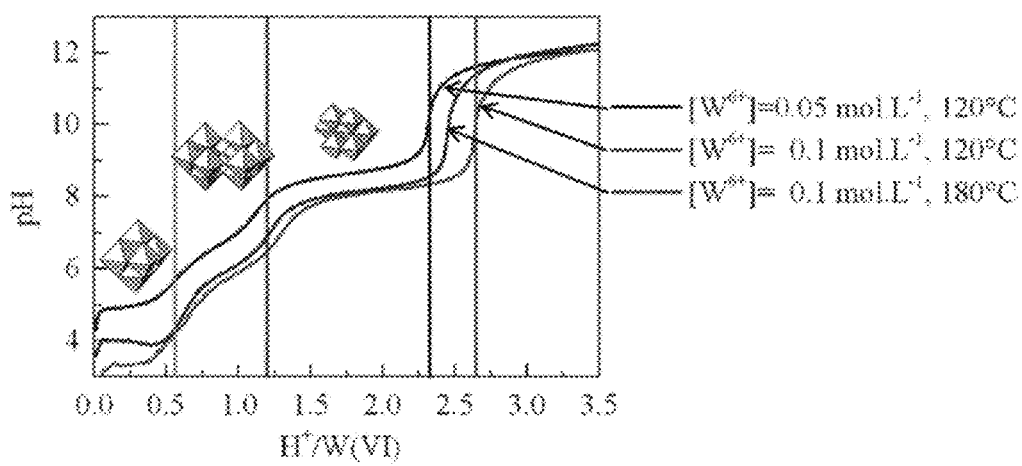
FIG. 1 illustrates titrimetric assay with sodium hydroxide (NaOH) of 20 ml of transparent solution synthesized in ethylene glycol according to Example 1.1 (dashed line: [$H_2WO_4$]=0.05 mol/L; solid line:[$H_2WO_4$]=0.1 mol/L).

TABLE 1 polyoxotungstate complexes formed in solution (computed from points of equivalence on the black curve in FIG. 1)

| Equivalence | X | Polyanions in the solvent before each equivalence |
|---|---|---|
| 1 | ~0.6 | $W_6O_{19}^{2-}$, |
| 2 | ~1.2 | $W_{10}O_{32}^{4-}$, |
| 3 | ~2.3 | $W_7O_{24}^{6-}$, |

X represents the number of moles of $H^+$ ions per mole of tungsten ion.

The compositions inferred from XPS surface analyses differ from those of the prior art: $WO_{2.985}$ and $WO_{2.97}$ for 3 and 6% $W^{5+}$ respectively, compared with $WO_{2.7}$ for example for the sol-gel film of Guillain et al.

Example 2: Use of the Solution to Fabricate an Organic Photovoltaic Cell

A conventional spin-coating is used to deposit the solution prepared in Example 1.1 to prepare a cell of standard architecture of glass/ITO/$WO_x$/P3HT:PCBM/Ca/Al type. In parallel, following a similar operating mode, a cell is prepared having the architecture glass/ITO/PEDOT:PSS/P3HT:PCBM/Ca/Al.

The changes in short-circuit current density Jsc (mA/cm$^2$) are then monitored as a function of changes in open-circuit voltage $V_{oc}$(V).

Figure 2:
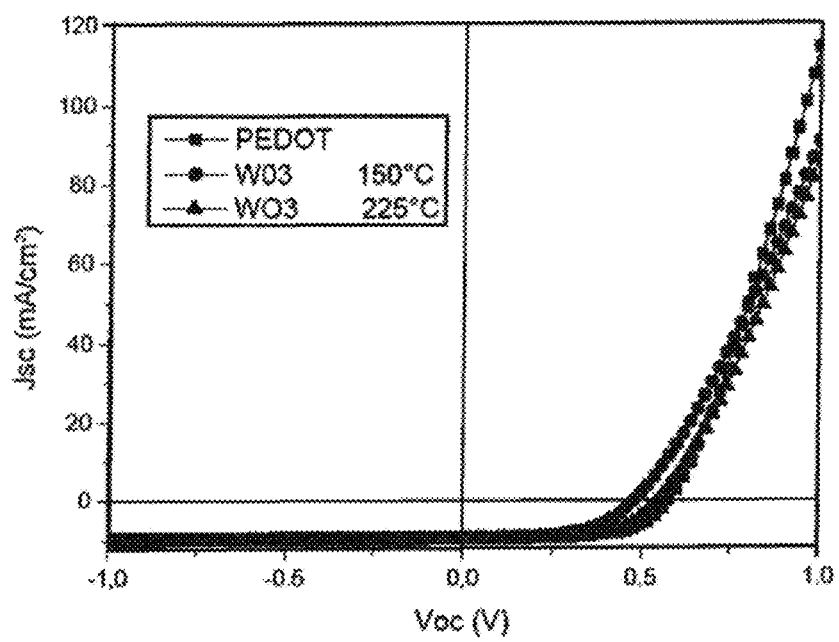
FIG. 2 illustrates the curves of standard architecture cells, glass/ITO/$WO_z$ or PEDOT:PSS/P3HT:PCBM/Ca/Al under AM 1.5 illumination at two different drying temperatures (150° C. and 225° C.) of the deposited film.

As illustrated in FIG. 2, the increase in drying temperature allows an increase in conversion yield up to a value higher than 3%. The improvement chiefly concerns open-circuit voltage and form factor. In comparison with a p-type conducting polymer conventionally used (PEDOT:PSS), irrespective of drying temperature, current density is greater on account of the transparency of the tungsten oxide layer prepared according to the present invention.

Table 2 below summarises the characteristics arising from intensity/voltage curves performed on the aforementioned standard architectures.

TABLE 2

| p-layer | Voc (mV) | Jsc (mA/cm$^2$) | FF (%) | PCE (%) |
|---|---|---|---|---|
| PEDOT:PSS | 579.2 | 8.78 | 63.5 | 3.30 |
| $WO_x$150° C. | 444.4 | 9.39 | 53.4 | 2.23 |
| $WO_x$225° C. | 547.2 | 9.53 | 60.1 | 3.13 |

Figure 3:
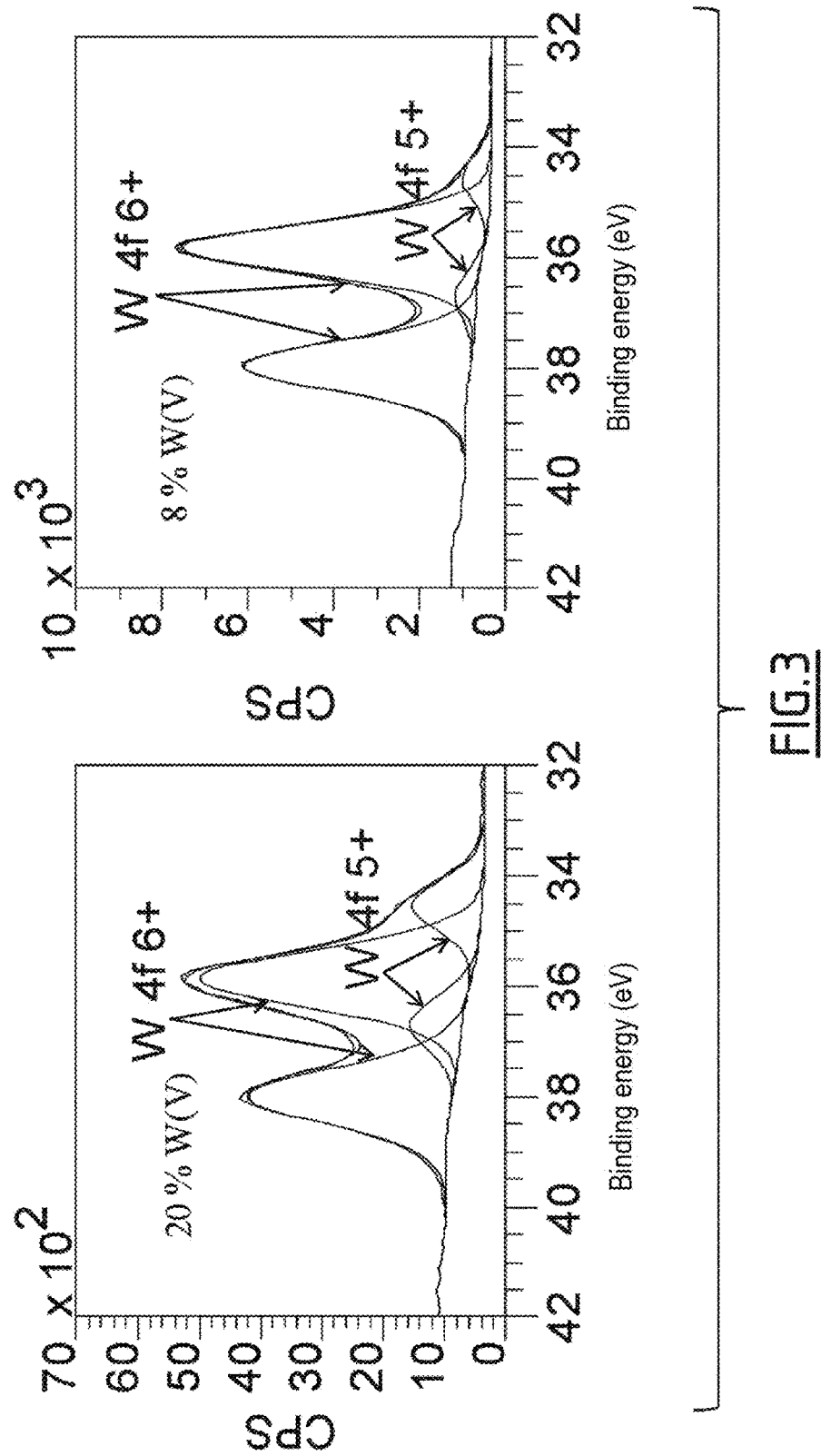
FIG. 3 illustrates XPS 4f level spectra of tungsten, energy calibration on C1s pollution at 284.7 eV, layers deposited on ITO treated at 150° C. (right) and 225° C. (left), for one hour.

FIG. 3 illustrates an XPS spectrum of a tungsten oxide layer deposited on ITO, dried at 150° C. (right) and 225° C. (left), for one hour.

Figure 4:
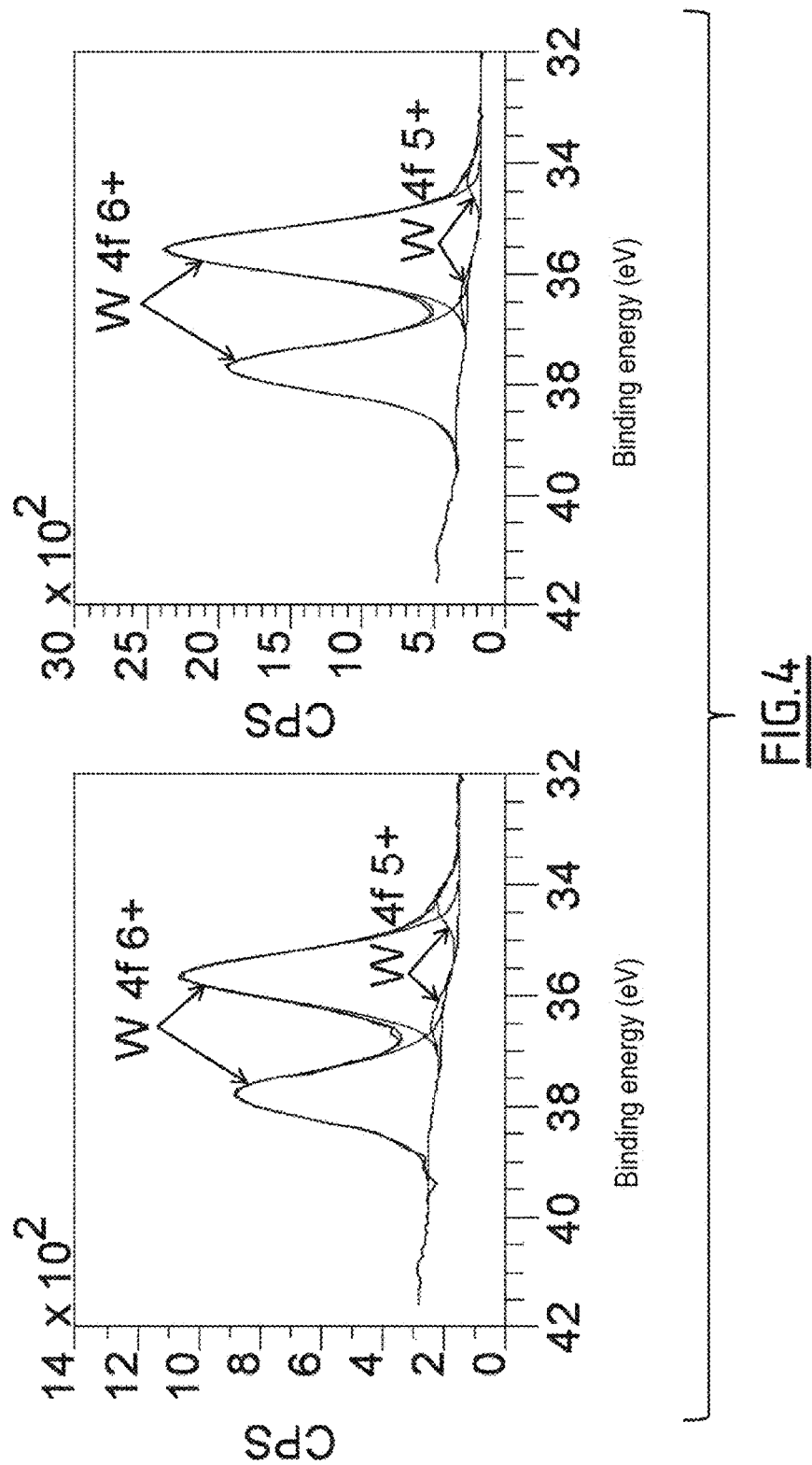
FIG. 4 illustrates XPS 4f electron level spectra of tungsten for cells analysed post-mortem, dried at 250° C. for one hour. The amounts of tungsten in oxidation state 5 are limited to 6 and 3% respectively, the conversion yield is directly correlated with this reduction percentage.

FIG. 4 illustrates an XPS spectrum of two cells analysed post-mortem after a drying time of one hour at 250° C. (on the left 6% $W^{5+}$ and on the right the spectrum with less than 3% $W^{5+}$).

Example 3: Methods for Forming the p-Interface Layer in a Standard OPV Architecture of PIN Type A tungstate ion solution according to the invention (in particular Example 1.1) is deposited on a transparent conductor or semiconductor substrate. The deposit methods used can be selected from among spin coating, coating/blading (Doctor Blade, slot die, tape casting), printing methods (ink jet, screen printing, heliogravure . . . ), etc. It is also possible to apply patterning to a substrate.

From a previously described tungstate ion solution according to the invention, the tungsten oxide layer is formed by ink jet printing, in particular by spin coating or coating, using a print platform integrating print modules generating droplets of 1 pL to 100 pL (pL: pico-litre). Depending on the type of underlying layer, print strategies are adapted to obtain homogeneous layers of desired thickness and the tungsten oxide concentration of the formulation used. The thermal annealing applied is similar to that used for the layers formed by coating. The layer according to the invention is used on a semiconductor surface of organic or hybrid solar cells.

Example 4: Preparation of Organic Photovoltaic Cells

The prepared photovoltaic cells comprise a substrate in glass or plastic (PET, PEN), coated with an ITO layer itself coated with an n-semiconductor oxide such as $TiO_2$. The latter is coated with an active film composed of a P3HT/PCBM mixture. The active layer is successively coated with a tungsten oxide layer prepared according to the present invention to form an interface layer, then with a silver anode.

The configuration of the cell is therefore the following: substrate/ITO/TiO$_2$/polymer+PCBM/WO$_z$/anode.

The conditions for spin coating deposition are the following:

Step 1: A layer of TiO$_2$ is prepared from a precursor solution by spin coating (see method in international application WO2013/050222). Coating time is 60 s at 1000 rpm$^{-1}$ then 30 s at 2000 rpm$^{-1}$. The thickness of the layer obtained is about 50 nm, deposition being performed in air, followed by drying over a hot plate at 150° C. for 1 h.

Step 2: Deposition of the active layer is performed by spin coating a composition of P3HT/PCBM, on the n layer, at about 1500 rpm$^{-1}$ for 40 s then 2000 rpm$^{-1}$ for 35 s.

Step 3: A tungsten oxide layer (about 50 nm) is deposited by spin coating at 2000 rpm$^{-1}$ for 25 s then 3000 rpm$^{-1}$ for 25 s.

The cell thus prepared is annealed in a glove box for 15 mn at 150° C.

Step 4: A silver electrode (100 nm) is then deposited by vacuum evaporation.

The cells are characterized in a glove box under a controlled atmosphere. The current-voltage characteristics (I(V)) are recorded on a Keithley® SMU 2400 instrument under AM1.5 illumination at a power of 1000 W·m$^{-2}$.

Example 5

The inventors have sought to improve the method for depositing the tungsten oxide layer to obtain optimal open-circuit voltage and optimal photovoltaic conversion efficiency.

Different drying temperatures were tested.

It appears that, on drying, a portion of the tungsten in oxidation state 6 is reduced to oxidation state 5. This mixed valence of the transition metal modifies the electronic properties of the semiconductor, which is undesirable. It is sought to prevent the presence of tungsten in oxidation state 5. The increase in temperature allows a decrease in the amount of reduced tungsten. This observation allows correlation between the best results of the photovoltaic cells and a lesser quantity of W$^{5+}$. XPS studies on photovoltaic cells analysed post-mortem confirmed this interpretation (FIG. 4).

Example 6

The inventors also used different concentrations of polyoxotungstate solution to optimise the homogeneity of the deposited films to prepare a photovoltaic cell. The tungstate ion solutions were concentrated before deposition on the substrate.

It was observed that the concentrated solutions always maintain their stability and transparency after evaporation of one half of the amount of solvent present. Solutions synthesized before and after «pre-concentration» were also deposited in thin films by spin coating onto ITO glass. FIG. 5 gives scanning microscope images of the surface of films dried at 50° C., 10 minutes, obtained with the parent solution of tungsten oxide precursors in propylene glycol solvent in an autoclave at 120° C. for 24 hours (left image), and with this pre-concentrated solution (right image) before deposition. The results obtained show that the films are more homogeneous when the solutions are more concentrated.

The invention claimed is:

1. A solution of tungstate ions W$^{6+}$ (VI) and counter-ions of the tungstate ions consisting of:
    as solvent at least one polyalcohol, optionally partly etherified,
    tungstate ions in the form of one or more polyoxotungstate complexes selected from the group consisting of [W$_6$O$_{19}$]$^{2-}$, [W$_{10}$O$_{32}$]$^{4-}$ and [W$_7$O$_{24}$]$^{6-}$; and
    H$^+$ protons, as counter ions of the tungstate ions.

2. The solution according to claim 1, wherein said at least one polyalcohol is a glycolic compound, optionally partly etherified.

3. The solution according to claim 1, wherein said at least one polyalcohol is ethylene glycol.

4. The solution according to claim 1, wherein said solution has a concentration of tungstate ions of 0.001 to 1 mol·L$^{-1}$.

5. The solution according to claim 1, wherein said solution is limpid.

6. The solution according to claim 1, wherein said solution has a dynamic viscosity of between 2 and 64 cP (mPa·s) at 25° C. and at atmospheric pressure (101 325 Pa).

7. The solution according to claim 1, wherein said solution has a dynamic viscosity of between 4 and 54 cP (mPa·s), at 25° C. and at atmospheric pressure (101325 Pa).

8. The solution according to claim 1, wherein said solution has a dynamic viscosity of between 4 and 25 cP (mPa·s), at 25° C. and at atmospheric pressure (101325 Pa).

9. The solution according to claim 1, wherein said solution has a dynamic viscosity of between 8 and 19 cP (mPa·s), at 25° C. and at atmospheric pressure (101325 Pa).

10. A method for preparing the solution according to claim 1, comprising increasing the temperature of a suspension or gel of H$_2$WO$_4$ as a polyoxotungstate complex precursor in a polyalcohol solvent.

11. The method according to claim 10, wherein the formation of the polyoxotungstate complex(es) is obtained by heating at a temperature higher than 120° C.

12. A method for preparing a layer of tungsten oxide WO$_z$ deposited on a solid substrate comprising deposition of the solution according to claim 1 on a solid substrate via a wet process and removal of the solvent from the solution in order to obtain a film of tungsten oxide WO$_z$ on the solid substrate, wherein z is greater than 2.7.

13. The method according to claim 11, wherein the removal of the solvent is conducted at a temperature higher than the boiling point of the solvent.

14. The method according to claim 11, wherein the deposition is performed by printing or coating selected from the group consisting of spin coating, ink jet printing, screen printing, heliogravure, slot die, roll to roll, or tape casting.

* * * * *